United States Patent
Lee

(10) Patent No.: US 8,999,064 B2
(45) Date of Patent: Apr. 7, 2015

(54) APPARATUS FOR FORMING THIN FILM

(75) Inventor: Sang-Woo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 886 days.

(21) Appl. No.: 13/179,463

(22) Filed: Jul. 8, 2011

(65) Prior Publication Data

US 2012/0024228 A1 Feb. 2, 2012

(30) Foreign Application Priority Data

Aug. 2, 2010 (KR) .................. 10-2010-0074723

(51) Int. Cl.
C23C 16/00 (2006.01)
C23C 14/24 (2006.01)
C23C 14/12 (2006.01)

(52) U.S. Cl.
CPC ............... *C23C 14/243* (2013.01); *C23C 14/12* (2013.01)

(58) Field of Classification Search
CPC ........ C23C 14/24; C23C 14/243; C23C 14/26
USPC .................................................. 118/726, 727
See application file for complete search history.

(56) References Cited

U.S. PATENT DOCUMENTS

| 2001/0011524 A1* | 8/2001 | Witzman et al. ............. 118/718 |
| 2006/0045958 A1* | 3/2006 | Abiko et al. ................... 427/66 |
| 2009/0130794 A1* | 5/2009 | Probst et al. ................... 438/84 |
| 2011/0027462 A1* | 2/2011 | Hwang et al. .................. 427/74 |

FOREIGN PATENT DOCUMENTS

| KR | 10-2007-0054418 A | 5/2007 |
| KR | 10-0794292 | 1/2008 |
| KR | 10-2008-0014316 A | 2/2008 |

* cited by examiner

*Primary Examiner* — Keath Chen
(74) *Attorney, Agent, or Firm* — Christie, Parker & Hale, LLP

(57) ABSTRACT

A thin film forming apparatus according to the embodiment includes a plurality of vapor deposition sources respectively separated from each other, a plurality of nozzle bodies connected to upper portions of the respective vapor deposition sources, and a plurality of nozzles connected to upper portions of the respective nozzle bodies. A nozzle hole of each of the nozzles is formed on a same vapor deposition line. Thus, according to the embodiment, the first organic material and the second organic material respectively sprayed through a first nozzle hole and a second nozzle hole can be uniformly mixed by disposing the first nozzle hole and the second nozzle on the same vapor deposition line.

26 Claims, 10 Drawing Sheets

APPARATUS FOR FORMING THIN FILM

CROSS-REFERENCE TO RELATED APPLICATION

This application claims priority to and the benefit of Korean Patent Application No. 10-2010-0074723, filed in the Korean Intellectual Property Office on Aug. 2, 2010, the entire content of which is incorporated herein by reference.

BACKGROUND

1. Field

The described technology relates generally to a thin film forming apparatus, and more particularly, it relates to an organic thin film forming apparatus for an organic light emitting diode (OLED) display.

2. Description of the Related Art

An organic light emitting diode (OLED) display includes two electrodes and an organic emission layer disposed between the two electrodes. Here, electrons injected from one electrode and holes injected from the other electrode are combined in the organic emission layer such that excitons are formed, and light is emitted by energy generated from the excitons.

An organic material should be vapor-deposited on a substrate in order to form, e.g., an organic emission layer. For example, the organic material is vapor-deposited by a vapor deposition source filled with an organic material and a thin film forming apparatus formed of a plurality of nozzles that spray (or vapor-deposit) the organic material heated in the vapor deposition source. The thin film forming apparatus can be changed to a linear vapor deposition type from a dotted vapor deposition source for increasing the size and reducing cost. A thin film forming apparatus formed of a linear vapor deposition source can simultaneously vapor-deposit the organic material in a linear direction so that the thickness uniformity of the organic material can be improved and the vapor-deposition speed of the organic material can be improved.

However, the organic emission layer or an electron transfer layer in the OLED display are formed by mixing a plurality of organic materials and vapor-depositing the mixture, and therefore a plurality of vapor deposition sources are used. In this case, since the plurality of vapor deposition sources are at different locations, a vapor deposition flux of an organic material sprayed from a nozzle of each vapor deposition source is created so that mixture uniformity of the mixed organic material may be deteriorated and a characteristic of the OLED display may be deteriorated.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the present invention is directed toward a thin film forming apparatus that can improve (or enhance) uniformity in a mixture of organic materials.

A thin film forming apparatus according to an exemplary embodiment includes a plurality of vapor deposition sources respectively separated from each other, a plurality of nozzle bodies connected to upper portions of the respective vapor deposition sources, and a plurality of nozzles connected to upper portions of the respective nozzle bodies, and a nozzle hole of each of the nozzles may be formed on a same vapor deposition line.

The plurality of vapor deposition sources may include a first vapor deposition source and a second vapor deposition source having a first gap therebetween, the plurality of nozzle bodies may include first and second nozzle bodies respectively connected to upper portions of the first and second vapor deposition sources, the plurality of nozzles may include a plurality of first nozzles and a plurality of second nozzles respectively connected to upper portions of the first and second nozzle bodies, and first nozzle holes of the first nozzles and second nozzle holes of the second nozzles may be disposed on the same vapor deposition line.

The vapor deposition line may be a straight line formed by extending in a portion of the first gap.

The first nozzles may be extended in a direction toward the vapor deposition line and the second nozzles may be extended in a direction toward the vapor deposition line.

The first nozzle may be extended forming a first angle with an upper surface of the first nozzle body and the second nozzle may be extended forming a second angle with an upper surface of the second nozzle body.

The first nozzle may be vertically extended at the upper surface of the first nozzle body and then horizontally extended, and the second nozzle may be vertically extended at the upper surface of the second nozzle body and then horizontally extended.

The first nozzles and the second nozzles may be alternately arranged.

The first vapor deposition source and the second vapor deposition source may be linear vapor deposition sources having bar-shaped planes.

The first and second nozzle bodies may have bar-shaped planes.

In addition, the thin film forming apparatus may further include a first connection pipe connecting the first vapor deposition source and the first nozzle body and a second connection pipe connecting the second vapor deposition source and the second nozzle body.

The first connection pipe may be disposed along a direction of the vapor deposition line and the second connection pipe may be disposed along a direction of the vapor deposition line.

The first connection pipe may be disposed forming a first angle with an upper surface of the first vapor deposition source, and the second connection pipe may be disposed forming a second angle with an upper surface of the second vapor deposition source.

The first connection pipe may be vertically extended at an upper surface of the first vapor deposition source and then horizontally extended, and the second connection pipe may be vertically extended at an upper surface of the second vapor deposition source and then horizontally extended.

The first and second vapor deposition sources may be dotted vapor deposition sources having circular or regular polygonal planes.

The first nozzle body may include a first fastening portion and the second nozzle body may include a second fastening portion coupled with the first fastening portion.

The first fastening portion may include a plurality of first recess and convex portions, and the second fastening portion may include a plurality of second recess and convex portions.

The first recess portions and the second convex portions may be fastened to each other, and the second recess portions and the first convex portions may be fastened to each other.

The first convex portions and the second convex portions may each be formed in the shape of a semi-sphere or a polygon.

One of the first nozzles may be disposed on a corresponding one of the first convex portions of the first nozzle body, and one of the second nozzles may be disposed on a corresponding one of the second convex portions of the second nozzle body.

The first and second nozzles may be disposed on the vapor deposition line.

The first and second vapor deposition sources may be linear vapor deposition sources having bar-shaped planes or dotted vapor deposition sources having circular or regular polygonal planes.

The thin film forming apparatus may further include a first vapor deposition source heater and a second vapor deposition source heater respectively attached to the surfaces of the first and second vapor deposition sources.

The thin film forming apparatus may further include a first nozzle body heater and a second nozzle body heater respectively attached to the surfaces of the first and second nozzle bodies.

The thin film forming apparatus may further include a first nozzle heater and a second nozzle heater respectively attached to the surfaces of the first and second nozzles.

The thin film forming apparatus may further include a first connection pipe heater and a second connection pipe heater respectively attached to the surfaces of the first and second connection pipes.

The first vapor deposition source may be filled with a first organic material, and the second vapor deposition source may be filled with a second organic material that is different from the first organic material.

According to the embodiment, the first and second organic materials respectively sprayed through the first and second nozzle holes can be uniformly mixed by disposing the first and second nozzle holes on the same vapor deposition line with the first and second nozzles inclined to a direction of the vapor deposition line.

In addition, the first and second organic materials respectively sprayed through the first and second nozzle holes can be uniformly mixed by disposing the first and second connection pipes inclined to a direction of the vapor deposition line and disposing the first and second nozzle holes on the same vapor deposition line with the first and second nozzles inclined to a direction of the vapor deposition line.

Further, the first and second organic materials respectively sprayed through the first and second nozzle holes can be uniformly mixed by disposing the first and second nozzle holes on the same vapor deposition line by arranging the first and second connection pipes inclined to a direction of the vapor deposition line and the first and second nozzle bodies coupled with each other by the first and second fastening portions.

DETAILED DESCRIPTION

Figure 1:
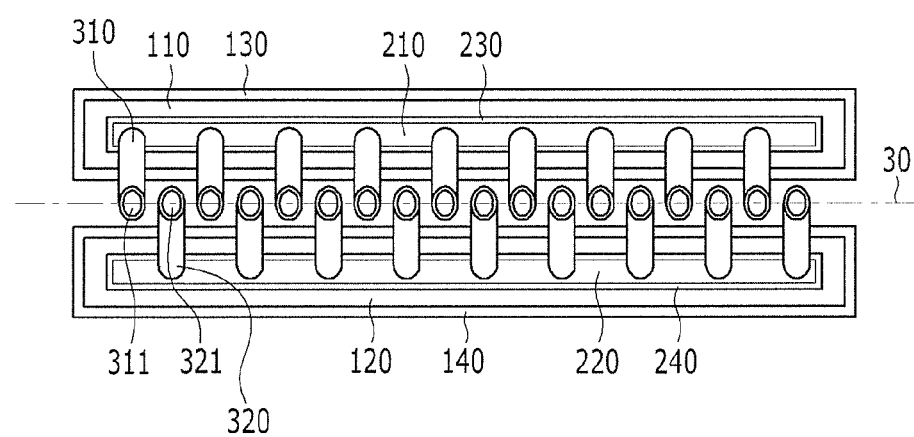
FIG. 1 is a top plan view of a thin film forming apparatus according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present therebetween.

A thin film forming apparatus according to a first exemplary embodiment will now be described in further detail with reference to FIG. 1 and FIG. 2.

Figure 2:
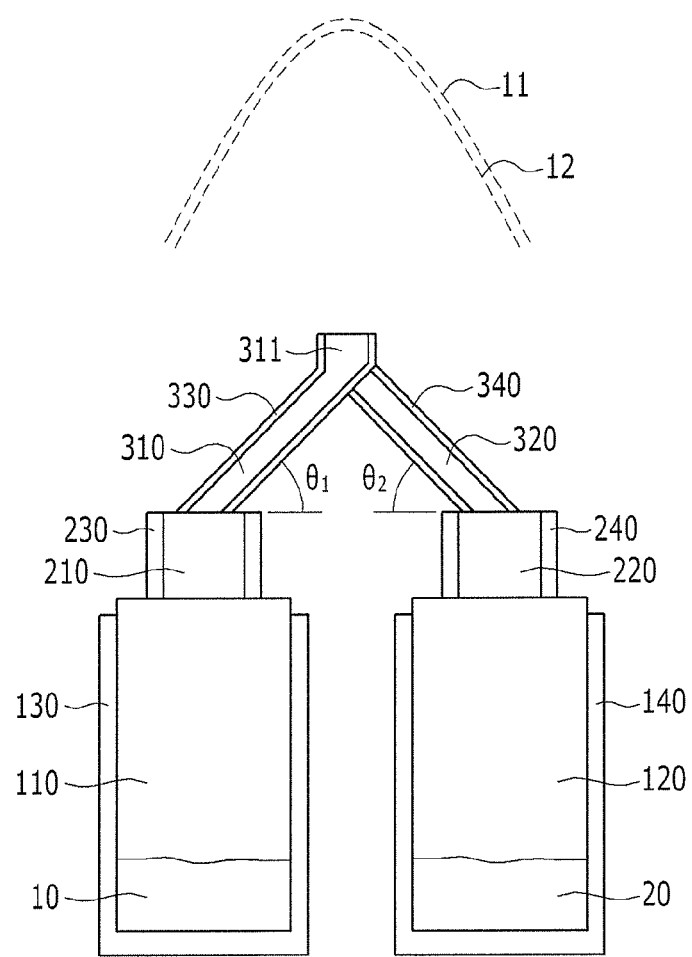
FIG. 2 is a side view of the thin film forming apparatus according to the first exemplary embodiment.
Figure 3:
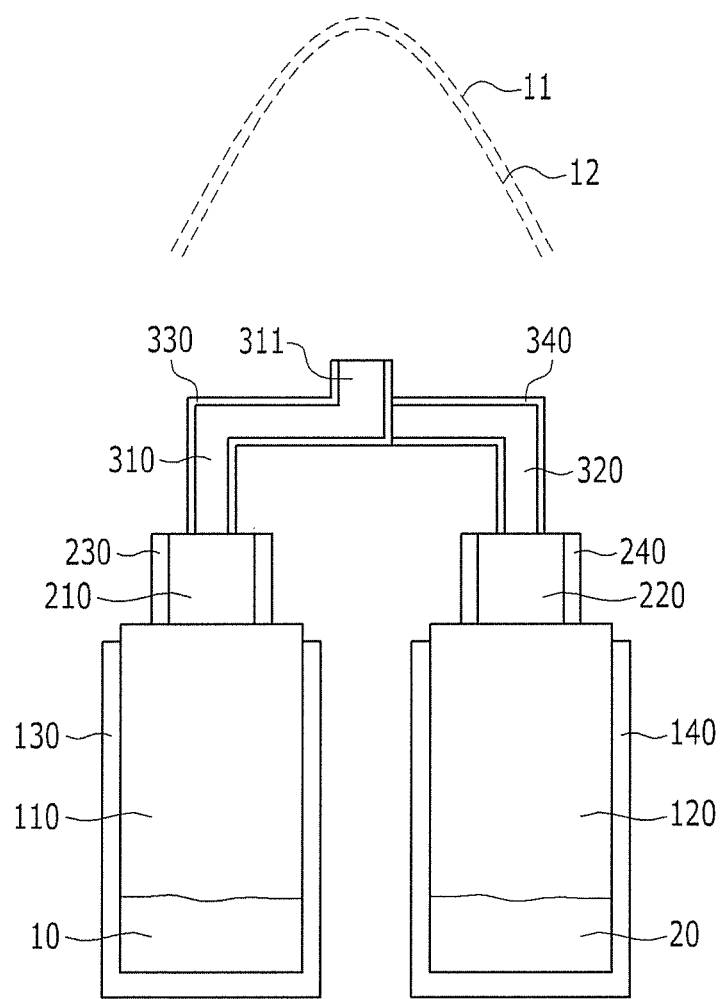
FIG. 3 is a side view of the thin film forming apparatus of FIG. 2 having different shaped first and second nozzles.

FIG. 1 is a top plan view of a thin film forming apparatus according to a first exemplary embodiment, FIG. 2 is a side view of the thin film forming apparatus according to the first exemplary embodiment, and FIG. 3 is a side view of the thin film forming apparatus of FIG. 2, having different shaped first and second nozzles.

As shown in FIG. 1 and FIG. 2, the thin film forming apparatus according to the first exemplary embodiment includes first and second vapor deposition sources 110 and 120 separated from each other, first and second nozzle bodies 210 and 220 respectively connected to upper portions of the first and second vapor deposition sources 110 and 120, and a plurality of first nozzles 310 and a plurality of second nozzles 320 respectively connected to upper portions of the first and second nozzle bodies 210 and 220.

The first vapor deposition source 110 and the second vapor deposition source 120 are formed in the shape of a rectangular parallelepiped, and they are linear vapor deposition sources of which plane shapes are bar shapes. The first vapor deposition source 110 is filled with a first organic material 10, and the second vapor deposition source 120 is filled with a second organic material 20. The first vapor deposition source 110 and the second vapor deposition source 120 have a first gap therebetween. A vapor deposition line 30 is formed at a portion that corresponds to a straight line formed by partially extending in the first gap. An organic mixture of the first organic material 10 and the second organic material 20 sprayed through the first nozzle 310 and the second nozzle 320 is formed on the vapor deposition line 30.

A first vapor deposition heater 130 is attached to a side wall and a bottom wall of the first vapor deposition source 110 to heat the first vapor deposition source 110. Thus, the first organic material 10 in the first vapor deposition source 110 is heated and vaporized, and the vaporized first organic material 10 moves to the first nozzle body 210. Further, a second vapor deposition heater 140 is attached to a side wall and a bottom wall of the second vapor deposition source 120 to heat the second vapor deposition source 120. Thus, the second organic material 20 in the second vapor deposition source 120 is heated and vaporized, and the vaporized second organic material 20 moves to the second nozzle body 220.

The first nozzle body 210 and the second nozzle body 220 are formed in the shape of a rectangular parallelepiped and have bar-shaped planes. The first nozzle body 210 and the second nozzle body 220 respectively attached on the first vapor deposition source 110 and the second vapor deposition source 120 and the plurality of first nozzles 310 and the plurality of second nozzles 320 are connected on the first and second nozzle bodies 210 and 220 so that the first organic material 10 and the second organic material 20 heated and vaporized in the first and second vapor deposition sources 110 and 120 are distributed through the plurality of first and second nozzles 310 and 320.

A first nozzle body heater 230 is attached to a side wall of the first nozzle body 210 to heat the first nozzle body 210. Thus, the first organic material 10 in the first nozzle body 210 can be transferred to the first nozzle 310 while maintaining its temperature. In addition, a second nozzle body heater 240 is attached to a side wall of the second nozzle body 220 to heat the second nozzle body 220. Thus, the second organic material 20 in the second nozzle body 220 can be transferred to the second nozzle 320 while maintaining its temperature.

The plurality of the first nozzles 310 are attached on the first nozzle body 210, and they are respectively separated with the same distance therebetween. Further, the plurality of the second nozzles 320 are attached on the second nozzle body 220, and they are separated from each other with the same distance therebetween.

The first nozzle 310 is extended while having a first inclined angle θ1 with an upper surface of the first nozzle body 210, and the second nozzle 320 is extended while having a second inclined angle θ2 with an upper surface of the second nozzle body 220. That is, the first nozzle 310 and the second nozzle 320 obliquely extend in a direction of the vapor deposition line 30.

A first nozzle hole 311 is disposed at an end of the first nozzle 310, and a central axis of the first nozzle hole 311 indicates a vertical direction. In addition, a second nozzle hole 321 is disposed at an end of the second nozzle 320, and a central axis of the second nozzle hole 321 indicates a vertical direction.

The first nozzle 310 and the second nozzle 320 can respectively control a vapor deposition flux of the first organic material 10 and a vapor deposition flux of the second organic material 20. As shown in FIG. 1 and FIG. 2, the first nozzles 310 and the second nozzles 320 are alternately arranged, and therefore the first nozzle holes 311 of the first nozzles 310 and the second nozzle holes 321 of the second nozzles 320 are alternately arranged. In this case, the first nozzle hole 311 of the first nozzle 310 and the second nozzle hole 321 of the second nozzle 320 are disposed on the same straight line, that is, the vapor deposition line 30. Thus, since a vapor deposition flux 11 of the first organic material 10 and a vapor deposition flux 12 of the second organic material 20 are identical, the first organic material 10 and the second organic material 20 are uniformly mixed and vapor-deposited on the substrate.

As described, the first nozzle hole 311 and the second nozzle hole 321 are disposed on the same vapor-deposition line 30 by the first and second nozzle 310 and 320 inclined to a direction of the vapor deposition line 30 so that the first organic material 10 and the second organic material 20 respectively sprayed through the first nozzle hole 311 and the second nozzle hole 321 can be uniformly mixed. Thus, the uniform mixture of the first organic material 10 and the second organic material 20 is vapor-deposited on the substrate.

The first nozzle heater 330 is attached to a side wall of the first nozzle 310 to heat the first nozzle 210 such that the temperature of the first organic material 10 in the first nozzle 310 can be maintained. In addition, the second nozzle heater 340 is attached to a side wall of the second nozzle 320 so that the temperature of the second organic material 20 in the second nozzle 320 can be maintained.

In order to dispose the first nozzle hole 311 of the first nozzle 310 and the second nozzle hole 321 of the second nozzle 320 on the same vapor deposition line 30, the first nozzle 310 is extended while having the first inclined angle θ1 with the upper surface of the first nozzle body 210 and the second nozzle 320 is extended while having the second inclined angle θ2 with the upper surface of the second nozzle 320. However, as shown in FIG. 3, the first nozzle 310 may be perpendicularly extended at the upper surface of the first nozzle body 320 and horizontally refracted (or horizontally changed in direction or horizontally extended); and the second nozzle 320 may be perpendicularly extended at the upper surface of the second nozzle body 220 and horizontally refracted. Meanwhile, if the first and second vapor deposition sources 110 and 120 are linear vapor deposition sources, the first and second nozzles 310 and 320 are extended to dispose the first and second nozzle holes 311 and 321 on the same vapor deposition line 30 (as shown in FIG. 1) to improve mixing uniformity of the organic mixture in the first exemplary embodiment. However, if first and second vapor deposition sources 110 and 120 are dotted vapor deposition sources, a first connection pipe 410 is disposed between the first vapor deposition source 110 and the first nozzle body 210, and a second connection pipe 420 is disposed between the second vapor deposition source 120 and the second nozzle body 220 to dispose the first nozzle hole 311 and the second nozzle hole 321 on the same vapor deposition line 30.

Hereinafter, a thin film forming apparatus according to a second exemplary embodiment will be described with reference to FIG. 4 to FIG. 6.

Figure 4:
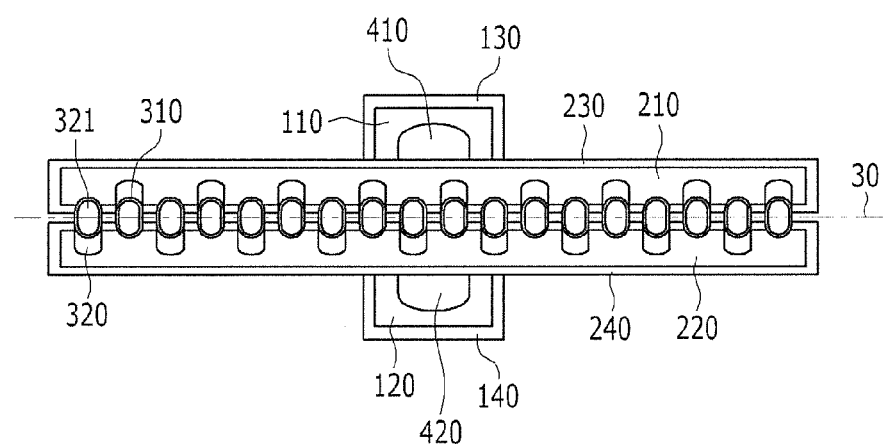
FIG. 4 is a top plan view of a thin film forming apparatus according to a second exemplary embodiment.
Figure 5:
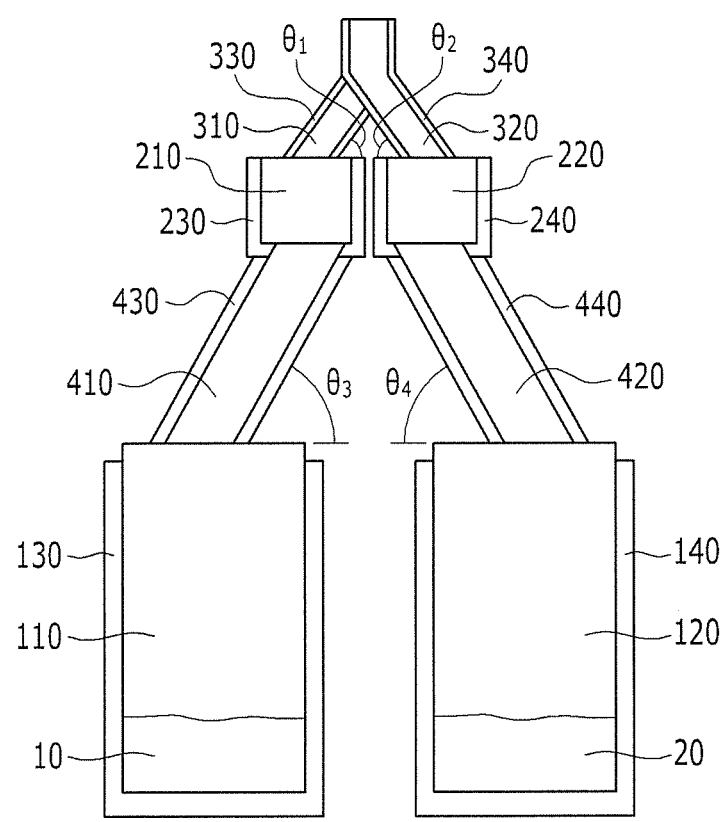
FIG. 5 is a side view of the thin film forming apparatus according to the second exemplary embodiment.
Figure 6:
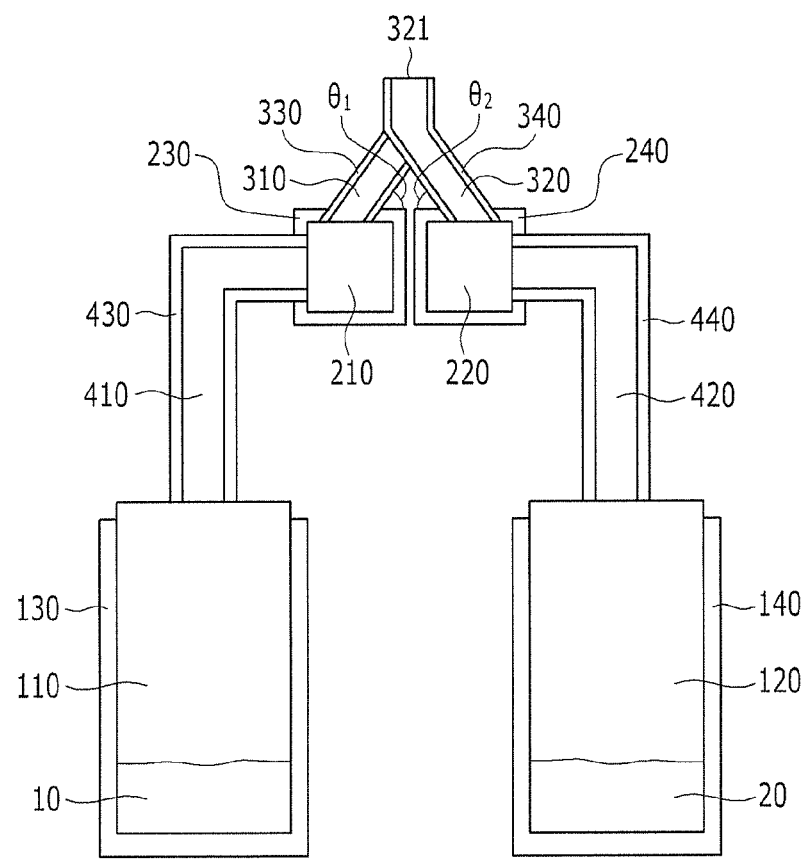
FIG. 6 is a side view of the thin film forming apparatus of FIG. 5, having different shaped first and second connection pipes.

FIG. 4 is a top plan view of a thin film forming apparatus according to a second exemplary embodiment, FIG. 5 is a side view of the thin film forming apparatus according to the second exemplary embodiment, and FIG. 6 is a side view of the thin film forming apparatus having different shaped first and second connection pipes as compared with the connection pipes of FIG. 5.

Compared to the first exemplary embodiment shown in FIG. 1 and FIG. 2, the second exemplary embodiment is the same as the first exemplary embodiment, excluding first and second vapor deposition sources, and therefore repeated description will be omitted.

As shown in FIG. 4 and FIG. 5, the thin film forming apparatus according to the second exemplary embodiment includes first and second vapor deposition sources 110 and 120 that are separated from each other; first and second nozzle bodies 210 and 220 respectively connected through the first vapor deposition source 110, the second vapor deposition source 120, a first connection pipe 410, and a second connection pipe 420; and a plurality of first nozzles 310 and a plurality of second nozzles 320 respectively connected to upper portions of the first and second nozzle bodies 210 and 220.

The first vapor deposition source 110 and the second vapor deposition source 120 may be dotted vapor deposition sources having a circular or regular polygonal shape. The first vapor deposition source 110 and the second vapor deposition source 120 are dot-shaped vapor deposition sources that respectively spray first and second organic materials 10 and 20 in a radial manner. The first vapor deposition source 110 and the second vapor deposition source 120 have a first gap therebetween.

The first connection pipe 410 forms a third inclined angle θ3 with an upper surface of the first vapor deposition source 110, and the second connection pipe 420 forms a fourth inclined angle θ4 with an upper surface of the second vapor deposition source 120. That is, the first connection pipe 410 is oblique to a direction of the vapor deposition line 30, and the second connection pipe 420 is oblique to a direction of the same vapor deposition line 30.

A first connection pipe heater 430 is attached to a side wall of the first connection pipe 410 to heat the first connection pipe 410, and a second connection pipe heater 440 is attached to a side wall of the second connection pipe 420 to heat the second connection pipe 420. Thus, the first organic material 10 heated in the first vapor deposition source 110 can move to the first nozzle body 210 through the first connection pipe 410 while maintaining the heated state, and the second organic material 20 heated in the second vapor deposition source 120 can move to the second nozzle body 220 through the second connection pipe 420 while maintaining the heated state.

The first nozzle body 210 is connected to an upper portion of the first connection pipe 410, and the second nozzle body 220 is connected to an upper portion of the second connection pipe 420. In this case, the upper portion of the first connection pipe 410 may be connected to a center portion of the first nozzle body 210 having a bar-shaped plane. This is for the purpose of uniformly spraying the first organic material 10 heated and vaporized in the first vapor deposition source 110 through the plurality of first nozzles 310 connected to the first nozzle body 210. Likely, the upper portion of the second connection pipe 420 may be connected to a center portion of the second nozzle body 220 having a bar-shaped plane.

The plurality of first nozzles 310 are attached on the first nozzle body 210 and respectively have a uniform gap therebetween. In addition, the plurality of second nozzles 320 are attached on the second nozzle body 220 and respectively have a uniform gap therebetween.

The first nozzle 310 is extended while forming a first inclined angle θ1 with an upper surface of the first nozzle body 210, and the second nozzle 320 is extended while forming a second inclined angle θ2 with an upper surface of the second nozzle body 220. That is, the first nozzle 310 is obliquely extended in a direction toward the vapor deposition line 30, and the second nozzle 320 is obliquely extended in a direction toward the vapor deposition line 30.

A first nozzle hole 311 is disposed at an end of the first nozzle 310, and a center axis of the first nozzle hole 311 indicates a vertical direction. In addition, a second nozzle hole 321 is disposed at an end of the second nozzle 320, and a central axis of the second nozzle hole 321 indicates a vertical direction.

The first nozzles 310 and the second nozzles 320 are alternately arranged, and therefore the first nozzle holes 311 of the first nozzles 310 and the second nozzle holes 321 of the second nozzles 320 are alternately arranged. In this case, the first nozzle hole 311 of the first nozzle 310 and the second nozzle hole 321 of the second nozzle 320 are disposed on the same straight line, that is, the vapor deposition line 30.

As described, the first and second connection pipes 410 and 420 oblique to the direction of vapor deposition line 30 are arranged, and the first nozzle hole 311 and the second nozzle hole 321 are disposed on the same vapor deposition line 30 by the first and second connection pipes 410 and 420 oblique to the direction of vapor deposition line 30 such that the first and second organic materials 10 and 20 respectively sprayed through the first and second nozzle holes 311 and 321 can be uniformly mixed. Thus, the uniform mixture of the first organic material 10 and the second organic material 20 is vapor-deposited on the substrate. In addition, in the second exemplary embodiment, the first and second vapor deposition sources 110 and 120 can be formed not as linear vapor deposition sources but as dotted vapor deposition sources by arranging (or by configuring) the first and second connection pipes 410 and 420.

In the above description, in order to dispose the first nozzle hole 311 of the first nozzle 310 and the second nozzle hole 321 of the second nozzle 320 on the same vapor deposition line 30, the first nozzle 301 is extended while forming the first inclined angle θ1 with the upper surface of the first nozzle body 210, the second nozzle 320 is extended while forming the second inclined angle θ2 with the upper surface of the second nozzle body 220, the first connection pipe 410 is arranged forming the third inclined angle θ3 with the upper surface of the first vapor deposition source 110, and the second vapor deposition source 120 is arranged forming the fourth inclined angle θ4 with the upper surface of the second vapor deposition source 120, but, as shown in FIG. 6, the first connection pipe 410 may be vertically extended at the upper surface of the first vapor deposition source 110 and then horizontally refracted, and the second connection pipe 420 may be vertically extended at the upper surface of the second vapor deposition source 120 and then horizontally refracted.

When the first connection pipe 410 and the second connection pipe 420 are refracted (or changed in direction), the vapor deposition direction of the first nozzle hole 311 of the first nozzle 310 and the second nozzle hole 321 of the second nozzle 320 may be changed to a horizontal direction.

Meanwhile, in the first exemplary embodiment, the first nozzle hole 311 and the second nozzle hole 321 are disposed on the same vapor deposition line 30 by extending in the first and second nozzles 310 and 320 to improve the mixing uniformity of the mixed organic material, but the first and second nozzle holes 311 and 321 may be disposed on the same vapor deposition line 30 by disposing the inclined first connection pipe 410 between the second vapor deposition line 110 and the first nozzle body 210 and the inclined second connection pipe 420 between the second vapor deposition source 120 and the second nozzle body 220 to couple the first and second nozzle bodies 210 and 220 with each other.

Hereinafter, a thin film forming apparatus according to a third exemplary embodiment will be described with reference to FIG. 7 to FIG. 9.

Figure 7:
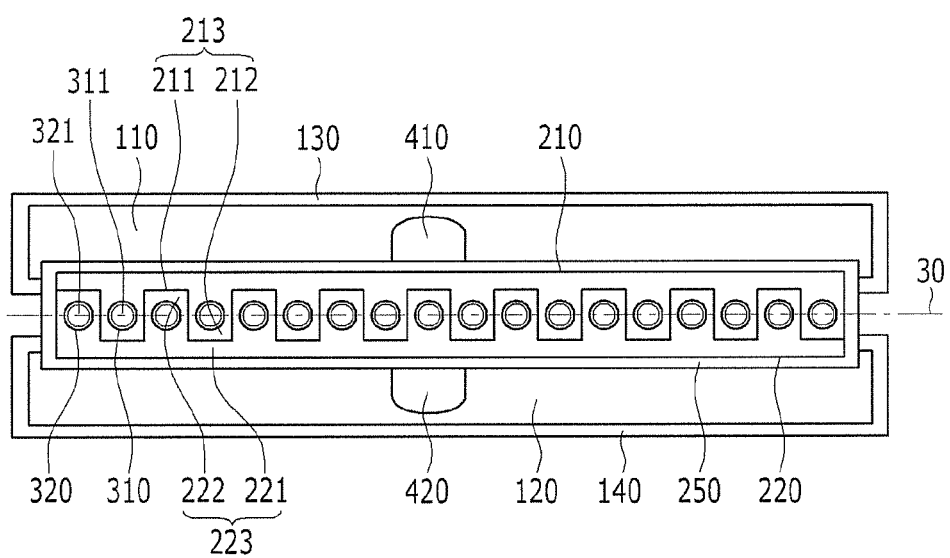
FIG. 7 is a top plan view of a thin film forming apparatus according to a third exemplary embodiment.
Figure 8:
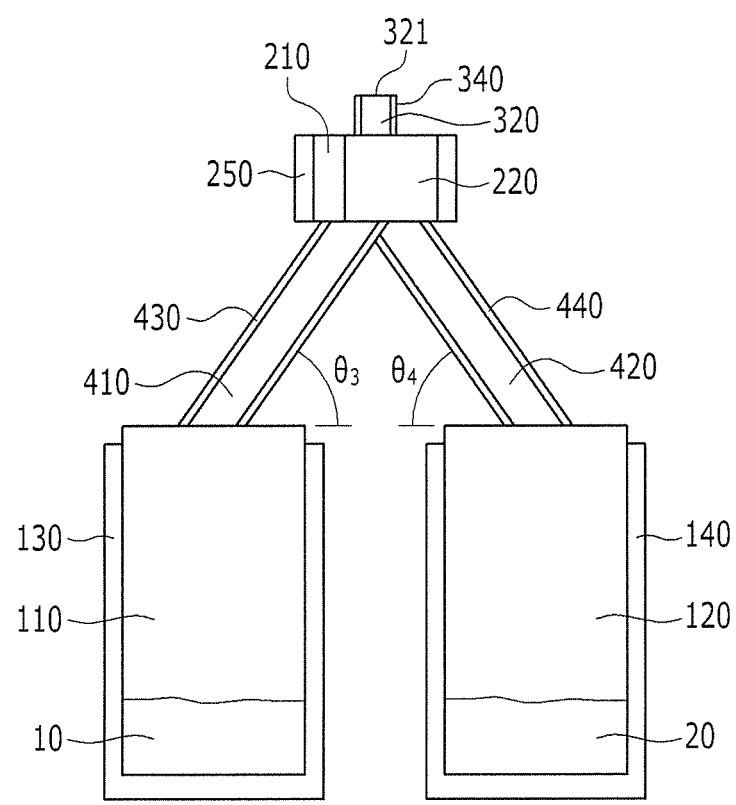
FIG. 8 is a side view of the thin film forming apparatus according to the third exemplary embodiment.
Figure 9:
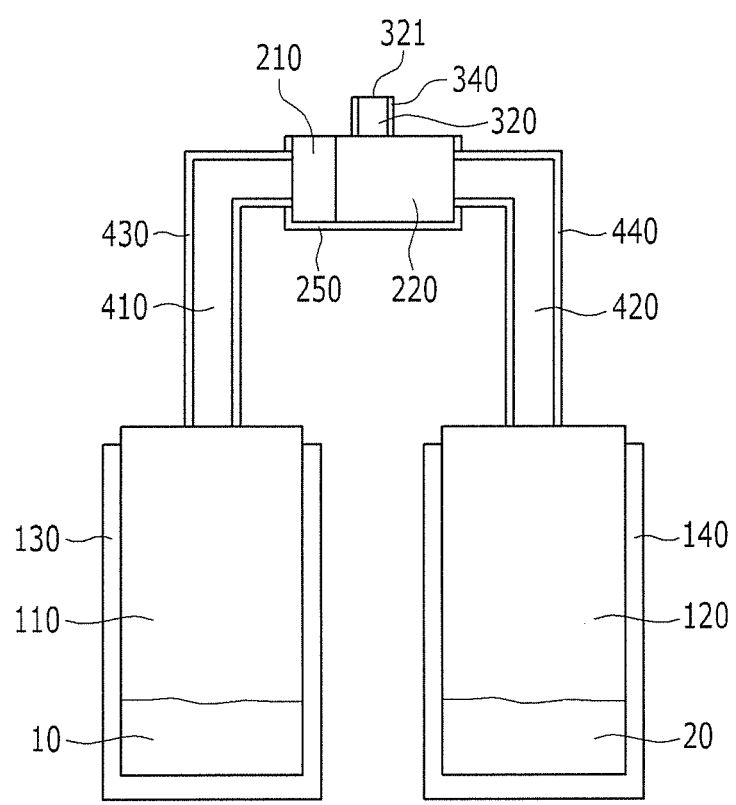
FIG. 9 is a side view of the thin film forming apparatus of FIG. 8, having different shaped first and second connection pipes.

FIG. 7 is a top plan view of a thin film forming apparatus according to a third exemplary embodiment, FIG. 8 is a side view of the thin film forming apparatus according to the third exemplary embodiment, and FIG. 9 is a side view of the thin film forming apparatus having different shaped first and second connection pipes as compared with the connection pipes of FIG. 8.

In the third exemplary embodiment, compared to the first exemplary embodiment shown in FIG. 1 and FIG. 2, with the exception of a first nozzle body 210, a second nozzle body 220, a first nozzle 310, and a second nozzle 320, the substantially repeated description will be omitted.

As shown in FIG. 7 and FIG. 8, the thin film forming apparatus according to the third exemplary embodiment includes first and second vapor deposition sources 110 and 120 that are separated from each other; first and second nozzle bodies 210 and 220 respectively connected through the first vapor deposition source 110, the second vapor deposition source 120, a first connection pipe 410, and a second connection pipe 420; and a plurality of first nozzles 310 and a plurality of second nozzles 320 respectively connected to upper portions of the first and second nozzle bodies 210 and 220.

The first vapor deposition source 110 and the second vapor deposition source 120 are linear vapor deposition sources formed in a rectangular parallelepiped shape, and have bar-shaped planes. The first vapor deposition source 110 is filled with a first organic material 10, and the second vapor deposition source 120 is filled with the second organic material 20. The first vapor deposition source 110 and the second vapor deposition source 120 have a first gap therebetween.

The first connection pipe 410 is disposed while forming a third inclined angle θ3 with an upper surface of the first vapor deposition source 110, and the second connection pipe 420 is disposed while forming a fourth inclined angle θ4 with an upper surface of the second vapor deposition source 120. That is, the first connection pipe 410 is oblique to a direction of the vapor deposition line 30, and the second connection pipe 420 is oblique to a direction of the same vapor deposition line 30.

The first nozzle body 210 is connected to an upper portion of the first connection pipe 410, and the second nozzle body 220 is connected to an upper portion of the second nozzle body 220.

The first nozzle body 210 includes a first fastening portion 213 at a side wall thereof, and the second nozzle body 220 includes a second fastening portion 223 at a side wall thereof. The first fastening unit 213 includes a plurality of first recess and convex portions 211 and 212, and the second fastening portion 223 includes a plurality of second recess and convex portions 221 and 222. In addition, the second convex portions 222 are disposed at the first recess portions 211 such that the first recess portions 211 of the first nozzle body 210 and the second convex portions 222 of the second nozzle body 220 are fastened with each other, and the first convex portions 212 are disposed at the second recess portions 221 such that the second recess portions 221 of the second nozzle body 220 and the first convex portions 212 of the first nozzle body 210 are fastened with each other. In the present exemplary embodiment, portions of the first and second fastening portions 213 and 223 each have a rectangular shape, but they may have a polygonal shape (e.g., triangle) or a semi-circular shape.

A nozzle body heater 250 is attached to a side wall of the combined first and second nozzle bodies 210 and 220 such that the first nozzle body 210 and the second nozzle body 220 can be simultaneously or concurrently heated.

The first nozzle 310 is disposed on the first convex portion 212 of the first nozzle body 210, and the second nozzle 320 is disposed on the second convex portion 222 of the second nozzle body 220. In addition, the first convex portions 212 and the second convex portions 222 are alternately arranged, and therefore the first nozzles and the second nozzles 320 are alternately arranged. Thus, the first nozzle holes 311 of the first nozzles 310 and the second nozzle holes 321 of the second nozzles 320 are disposed on the same vapor deposition line 30.

The first organic material 10 in the first nozzle 310 is externally sprayed through the first nozzle hole 311, and the second organic material 20 in the second nozzle 320 is externally sprayed through the second nozzle hole 321. The first nozzle 310 and the second nozzle 320 respectively spray the first and second organic materials 10 and 20 on the substrate through the first nozzle hole 311 and the second nozzle hole 321.

As described, the first nozzle body 210 and the second nozzle body 220 are disposed on the same vapor deposition line 30 by arranging the first and second nozzle bodies 210 and 220 coupled by the first and second connection pipes 410 and 420 inclined to the direction of the vapor deposition line 30 and the first and second fastening portions 213 and 223 such that the first and second organic materials 10 and 20 respectively sprayed through the first nozzle hole 311 and the second nozzle hole 321 can be uniformly mixed. Thus, a uniform mixture of the first organic material 10 and the second organic material 20 is vapor-deposited on the substrate.

In the above description, the inclined first and second connection pipes 410 and 420 respectively having the third and fourth inclination angles θ3 and θ4 in the direction of the vapor deposition line 30, and the first and second nozzle bodies 210 and 220 are coupled to each other by the first and second fastening portions 213 and the 223 to dispose the first nozzle hole 311 of the first nozzle 310 and the second nozzle hole 321 of the second nozzle 320 on the same vapor deposition line 30. However, the present invention is not thereby limited. For example, as shown in FIG. 9, the first connection pipe 410 may be vertically extended at the upper surface of the first deposition source 110 and then horizontally refracted, and the second connection pipe 420 may be vertically extended at the upper surface of the second vapor deposition source 120 and then horizontally refracted.

In the third exemplary embodiment, the first and second vapor deposition sources 110 and 120 are linear vapor deposition lines formed in the shape of rectangular parallelepiped and having bar-shaped planes, but the first and second vapor deposition sources 110 and 120 may be formed as dotted vapor deposition sources by disposing the first connection pipe 410 and the second connection pipe 420.

Hereinafter, a thin film forming apparatus according to a fourth exemplary embodiment will be described with reference to FIG. 10 and FIG. 11.

Figure 10:
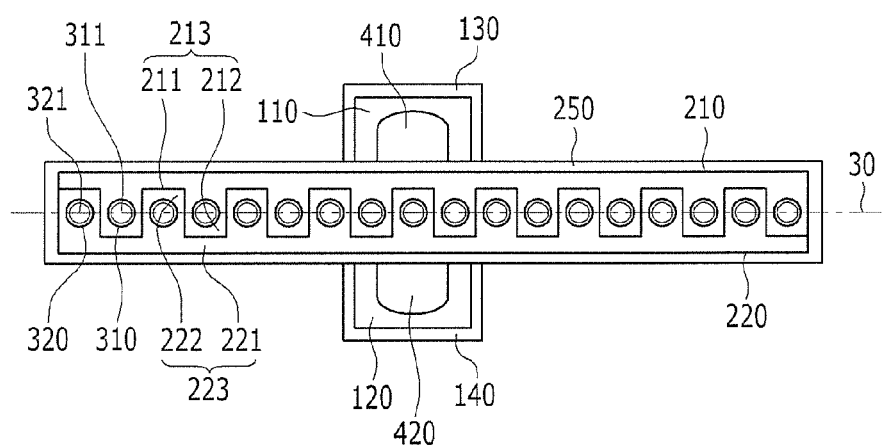
FIG. 10 is a top plan view of a thin film forming apparatus according to a fourth exemplary embodiment.
Figure 11:
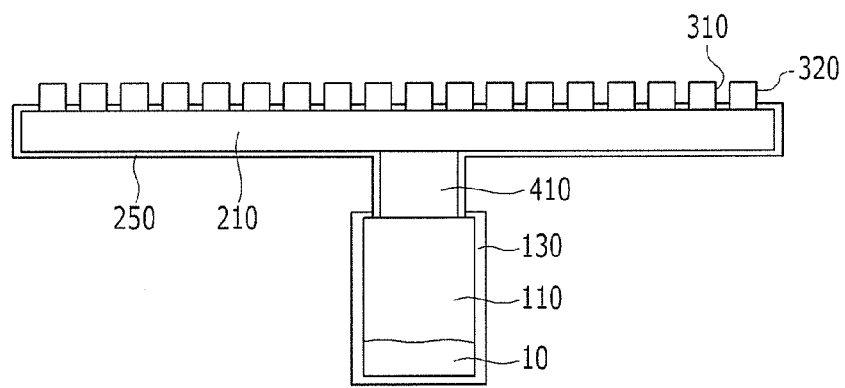
FIG. 11 is a side view of the thin film forming apparatus according to the fourth exemplary embodiment.

FIG. 10 is a top plan view of a thin film forming apparatus according to a fourth exemplary embodiment and FIG. 11 is a side view of the thin film forming apparatus according to the fourth exemplary embodiment.

The fourth exemplary embodiment is substantially the same as the third exemplary embodiment of FIG. 7 and FIG. 8, excluding first and second vapor deposition sources, and therefore the repeated description will not be provided.

As shown in FIG. 10 and FIG. 11, a thin film forming apparatus according to the fourth exemplary embodiment includes first and second vapor deposition sources 110 and 120 separated from each other; first and second nozzle bodies 210 and 220 respectively connected through the first vapor deposition source 110, the second vapor deposition source 120, a first connection pipe 410, and a second connection pipe 420; and a plurality of first nozzles 310 and a plurality of second nozzles respectively connected to upper portions of the first and second nozzle bodies 210 and 220.

The first vapor deposition source 110 and the second vapor deposition source 120 may be dotted vapor deposition sources having circular or regular polygonal planes. The first vapor deposition source 110 and the second vapor deposition source 120 are dotted vapor deposition sources respectively spraying first and second organic materials 10 and 20 in a radial manner. The first vapor deposition source 110 and the second vapor deposition source 120 have a first gap therebetween.

As described, the first connection pipe 410 is disposed between the first vapor deposition source 110 and the first nozzle body 210, and the second connection pipe 420 is disposed between the second vapor deposition source 120 and the second nozzle body 220, such that the first and second organic materials 10 and 20 are respectively sprayed through the first and second nozzle bodies 210 and 220 respectively separated with the first and second vapor deposition sources 110 and 120, and therefore the first and second vapor deposition sources 110 and 120 are not limited to the linear vapor deposition sources. Thus, the first vapor deposition source 110 and the second vapor deposition source 120 may have various shapes, and as in the fourth exemplary embodiment, they may be dotted vapor deposition sources.

In the exemplary embodiment, the first and second nozzle holes 311 and 321 are disposed on the same vapor deposition line 30 in the first vapor deposition source 110 and the second vapor deposition source 120, but each nozzle hole may be disposed on the same vapor deposition line 30 in three or more vapor deposition sources for vapor deposition of the uniform organic mixture on the substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 110: first vapor deposition source | |
| 120: second vapor deposition source | |
| 210: first nozzle body | 220: second nozzle body |
| 310: first nozzle | 320: second nozzle |
| 410: first connection pipe | 420: second connection pipe |

What is claimed is:

1. A thin film forming apparatus comprising:

a plurality of vapor deposition sources separated from each other;

a plurality of nozzle bodies connected to upper portions of the vapor deposition sources; and a plurality of nozzles connected to upper portions of the nozzle bodies, wherein a nozzle hole of each of the nozzles is formed on a same vapor deposition line, and wherein each of the nozzle holes is the same size to uniformly mix a plurality of organic materials contained in the plurality of vapor deposition sources, wherein the plurality of vapor deposition sources comprise a first vapor deposition source and a second vapor deposition source having a first gap therebetween, the plurality of nozzle bodies comprise a first nozzle body connected to an upper portion of the first vapor deposition source and a second nozzle body connected to an upper portion of the second vapor deposition source, the plurality of nozzles comprises a plurality of first nozzles connected to an upper portion of the first nozzle body and a plurality of second nozzles connected to an upper portion of the second nozzle body, and all of first nozzle holes of the first nozzles and all of second nozzle holes of the second nozzles are disposed on the same vapor deposition line.

2. The thin film forming apparatus of claim 1, wherein the vapor deposition line is a straight line formed by extending in a portion of the first gap.

3. The thin film forming apparatus of claim 2, wherein the first nozzles are extended in a direction toward the vapor deposition line and the second nozzles are extended in a direction toward the vapor deposition line.

4. The thin film forming apparatus of claim 3, wherein the first nozzle is extended forming a first angle with an upper surface of the first nozzle body and the second nozzle is extended forming a second angle with an upper surface of the second nozzle body.

5. The thin film forming apparatus of claim 3, wherein the first nozzle is vertically extended at an upper surface of the first nozzle body and then horizontally extended, and the second nozzle is vertically extended at an upper surface of the second nozzle body and then horizontally extended.

6. The thin film forming apparatus of claim 3, wherein the first nozzles and the second nozzles are alternately arranged.

7. The thin film forming apparatus of claim 3, wherein the first vapor deposition source and the second vapor deposition source are linear vapor deposition sources having bar-shaped planes.

8. The thin film forming apparatus of claim 3, wherein the first and second nozzle bodies have bar-shaped planes.

9. The thin film forming apparatus of claim 1, further comprising:

a first connection pipe connecting the first vapor deposition source and the first nozzle body, and a second connection pipe connecting the second vapor deposition source and the second nozzle body.

10. The thin film forming apparatus of claim 9, wherein the first connection pipe is disposed along a direction of the vapor deposition line and the second connection pipe is disposed along a direction of the vapor deposition line.

11. The thin film forming apparatus of claim 10, wherein the first connection pipe is disposed forming a first angle with an upper surface of the first vapor deposition source, and the second connection pipe is disposed forming a second angle with an upper surface of the second vapor deposition source.

12. The thin film forming apparatus of claim 10, wherein the first connection pipe is vertically extended at an upper surface of the first vapor deposition source and then horizontally extended, and the second connection pipe is vertically extended at an upper surface of the second vapor deposition source and then horizontally extended.

13. The thin film forming apparatus of claim 9, wherein the first and second vapor deposition sources are dotted vapor deposition sources having circular or regular polygonal planes.

14. The thin film forming apparatus of claim 9, wherein the first nozzle body comprises a first fastening portion, and the second nozzle body comprises a second fastening portion coupled with the first fastening portion.

15. The thin film forming apparatus of claim 14, wherein the first fastening portion comprises a plurality of first recess portions and a plurality of first convex portions, and the second fastening portion comprises a plurality of second recess portions and a plurality of second convex portions.

16. The thin film forming apparatus of claim 15, wherein the first recess portions and the second convex portions are fastened to each other, and the second recess portions and the first convex portions are fastened to each other.

17. The thin film forming apparatus of claim 15, wherein the first convex portions and the second convex portions are each formed in the shape of a semi-sphere or a polygon.

18. The thin film forming apparatus of claim 15, wherein one of the first nozzles is disposed on a corresponding one of the first convex portions of the first nozzle body, and one of the second nozzles is disposed on a corresponding one of the second convex portions of the second nozzle body.

19. The thin film forming apparatus of claim 14, wherein the first and second nozzles are disposed on the vapor deposition line.

20. The thin film forming apparatus of claim 14, wherein the first and second vapor deposition sources are linear vapor deposition sources having bar-shaped planes.

21. The thin film forming apparatus of claim 14, wherein the first and second vapor deposition sources are dotted vapor deposition sources having circular or regular polygonal planes.

22. The thin film forming apparatus of claim 9, further comprising a first connection pipe heater attached to a surface of the first connection pipe, and a second connection pipe heater attached to a surface of the second connection pipe.

23. The thin film forming apparatus of claim 1, further comprising a first vapor deposition source heater attached to a surface of the first vapor deposition source, and a second vapor deposition source heater attached to a surface of the second vapor deposition source.

24. The thin film forming apparatus of claim 1, further comprising a first nozzle body heater attached to a surface of the first nozzle body, and a second nozzle body heater attached to a surface of the second nozzle body.

25. The thin film forming apparatus of claim 1, further comprising a first nozzle heater attached to a surface of each of the first nozzles, and a second nozzle heater attached to a surface of each of the second nozzles.

26. The thin film forming apparatus of claim 1, wherein the first vapor deposition source is filled with a first organic material, and the second vapor deposition source is filled with a second organic material differing from the first organic material.

* * * * *